(12) United States Patent
Chang

(10) Patent No.: US 6,273,730 B1
(45) Date of Patent: Aug. 14, 2001

(54) INDUSTRIAL COMPUTER MAINFRAME STRUCTURE

(76) Inventor: Lin-Heng Chang, 6F, No. 25, Alley 141, Lane 189, Sec 3, Kan-ning Rd., Nei-Hu, Taipei (TW)

(*) Notice: Subject to any disclaimer, the term of this patent is extended or adjusted under 35 U.S.C. 154(b) by 0 days.

(21) Appl. No.: 09/517,747

(22) Filed: Mar. 3, 2000

(51) Int. Cl.$^7$ ................................................ H01R 12/00
(52) U.S. Cl. ................................................................ 439/61
(58) Field of Search ........................ 439/629, 174, 439/620, 74, 75, 61, 62; 361/683, 685, 764, 773, 785–792, 796, 733

(56) References Cited

U.S. PATENT DOCUMENTS

| | | | |
|---|---|---|---|
| 4,733,461 | * 3/1988 | Nakano | 439/620 |
| 5,556,286 | * 9/1996 | Ikesugi et al. | 439/74 |
| 5,557,506 | * 9/1996 | Wood et al. | 361/796 |
| 5,575,686 | * 11/1996 | Noschese | 439/620 |
| 5,797,757 | * 11/1996 | Aoki | 439/101 |
| 5,825,630 | * 10/1998 | Taylor et al. | 361/790 |
| 5,841,636 | * 11/1998 | Hsu et al. | 361/752 |
| 6,004,142 | * 12/1999 | Wark | 439/74 |

FOREIGN PATENT DOCUMENTS 6-251834 * 6/1994 (JP) ...................................... 439/629

* cited by examiner

*Primary Examiner*—Neil Abrams
*Assistant Examiner*—J. F. Duverne
(74) *Attorney, Agent, or Firm*—Dougherty & Troxell

(57) ABSTRACT

An industrial computer mainframe structure includes a housing having a motherboard provided thereon. The motherboard is provided with more than one insert slot. The insert slots have connecting elements inserted therein. The housing has more than one horizontal bar mounted at an open end thereof. The horizontal bar is parallel to the motherboard and passes through the insert slots, and is provided with a connecting element. In use, the connecting elements inserted in the insert slots are prevented from shaking by being secured on the horizontal bar. Mainboards may be inserted in connecting slots of the connecting elements to enable the mainboards on the motherboard to extend along a horizontal direction. In this way, the profile of the mainboards is lower than the prior art in which the mainboards are directly inserted into the insert slots. The height of the overall housing can also be reduced to allow stacking of more housings.

2 Claims, 3 Drawing Sheets

INDUSTRIAL COMPUTER MAINFRAME STRUCTURE

BACKGROUND OF THE INVENTION (a) Field of the Invention

The present invention relates to an industrial computer mainframe structure which employs connecting slots of connecting elements to enable mainboards to extend in a horizontal direction instead of being erected in insert slots of the motherboard to thereby reduce the profile of the circuit boards and permit mounting thereof in a computer housing of a height below 2U (1U=4.445 cm).

(b) Description of the Prior Art

With reference to FIG. 3, a conventional industrial computer mainframe includes an open housing 100 having a motherboard 200 disposed thereon. The motherboard 200 has a power supply 201 disposed thereon, and is provided with a plurality of insert slots 202. In use, mainboards 300 having different functions may be inserted into the insert slots 202 uprightly so that the motherboard 200 can be connected to the mainboards 300 via the insert slots 202. However, since the mainboards 300 are erected in the insert slots 202, if the height of the mainboards 300 exceed that of the housing 100, either it is not possible to stack another housing 100 atop the housing 100 or the height of the housing 100 will need to be increased, which will be very space occupying.

SUMMARY OF THE INVENTION

A primary object of the present invention is to provide an industrial computer mainframe structure which includes a housing having a motherboard disposed thereon. The motherboard is provided with at least one insert slot. The insert slots receive connecting elements. A horizontal bar is provided with a connecting element. In use, mainboards of the motherboard are inserted into connecting slots of the connecting elements so that they can extend along a horizontal direction. In this way, the profile of the mainboards is lower than the prior art in which the mainboards are directly inserted into the insert slots, and the overall height of the housing can be reduced to allow stacking or more housings.

Another object of the present invention is to provide an industrial computer mainframe structure in which the open end of a housing has at least one horizontal bar mounted thereon. The horizontal bar is parallel to the motherboard and passes through insert slots on the housing. In use, connecting elements inserted in the insert slots may be secured on the horizontal bar to enhance stability thereof.

BRIEF DESCRIPTION OF THE DRAWINGS

The foregoing and other features and advantages of the present invention will be more clearly understood from the following detailed description and the acompanying drawings, in which.

DETAILED DESCRIPTION OF THE PREFERRED EMBODIMENT

Figure 1:
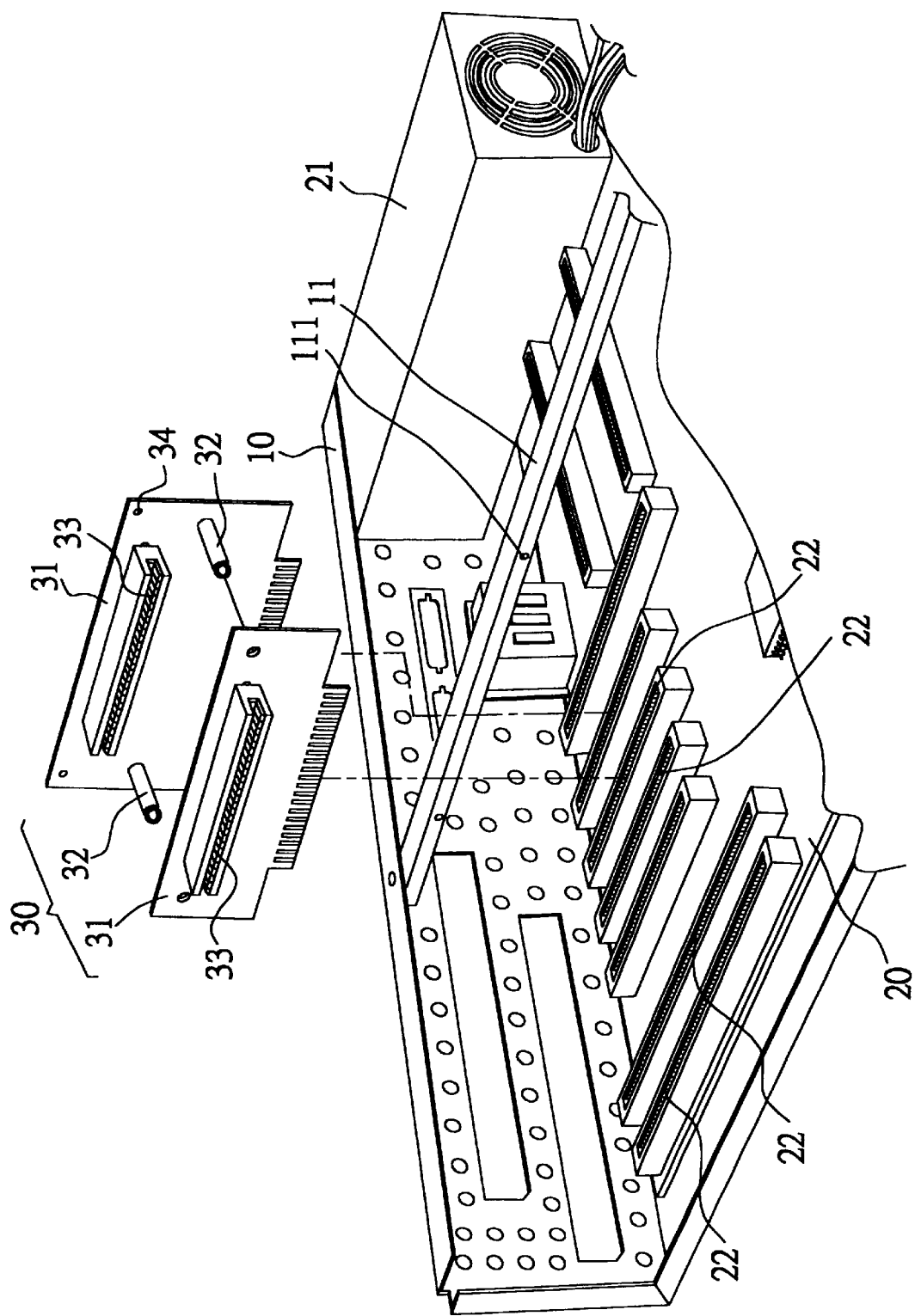
FIG. 1 is an exploded perspective view of the present invention.

With reference to FIG. 1, an industrial computer mainframe structure according to the present invention includes an open housing 10 which, in this embodiment, has a height below 2U (1U=4.445 cm). The housing 10 has a motherboard 20 disposed thereon. The motherboard 20 has a power supply 21 provided thereon. The motherboard 20 further has more than one insert slot 22 provided thereon in a suitable positions. The insert slots 22 receive corresponding connecting elements 30. The connecting elements 30 have circuit boards 31 connecting in series in a stepped arrangement provided thereon. The circuit boards 31 may be connected in series by means of links 32, and have at least one connecting slot 33 disposed perpendicularly thereon.

Furthermore, the connecting elements 30 are provided with through holes 34. At the open end of the housing 10, more than one horizontal bar 11 is mounted to be parallel to the motherboard 20 and to pass over the insert slots 22. The horizontal bar 11 is provided with more than one hole 111. In use, the connecting elements 30 in the insert slots 22 may, by means of securing elements 40 (securing bolts in this embodiment) passing through the through holes 34 of the connecting elements 30 and the hole 111 of the horizontal bar 11, have the ends distal to the insert slots 22 secured on the horizontal bar 11, whereby the connecting elements 30 can be firmly secured and prevented from shaking, as shown in FIG. 2.

Figure 2:
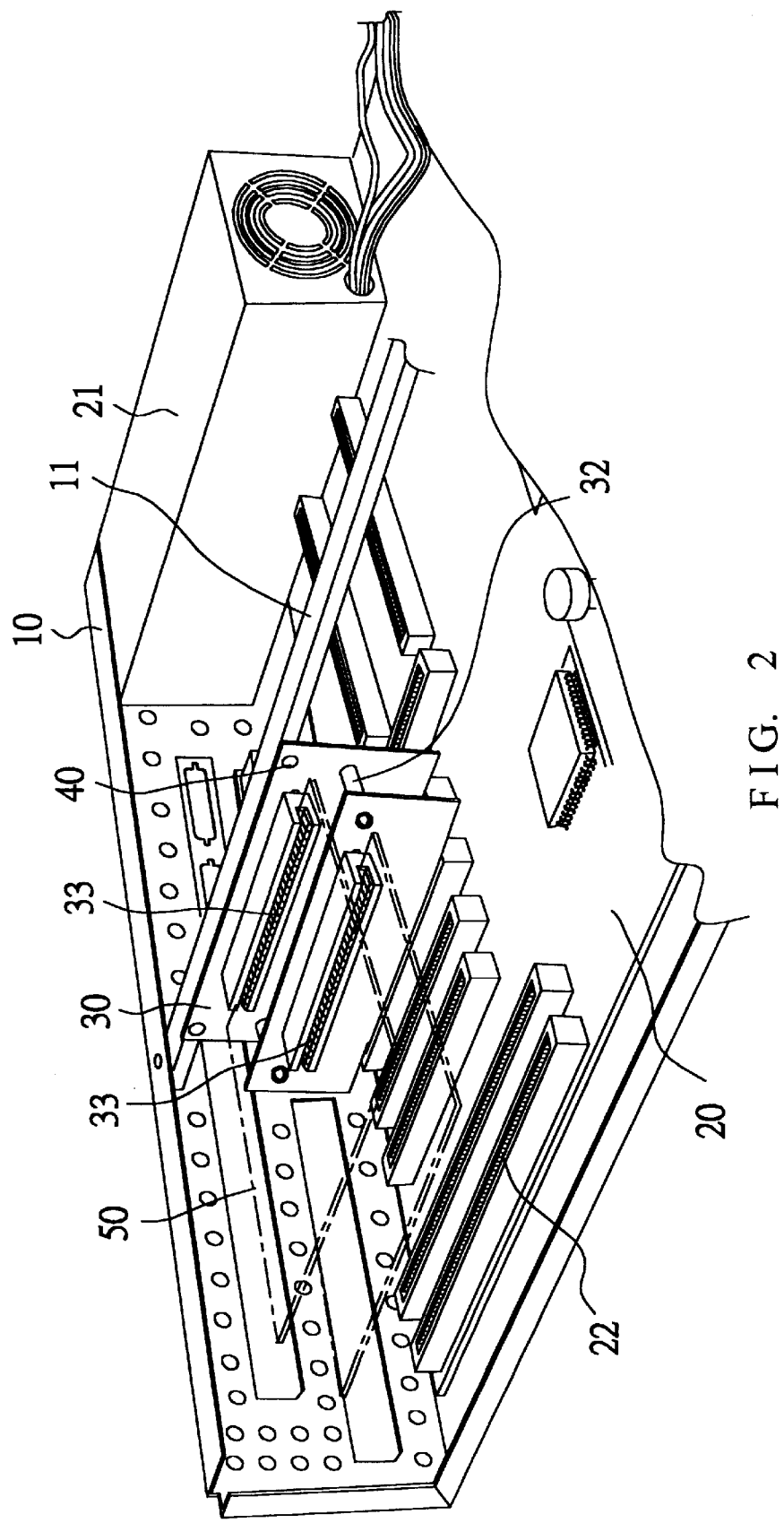
FIG. 2 is an assembled perspective view of the present invention.
Figure 3:
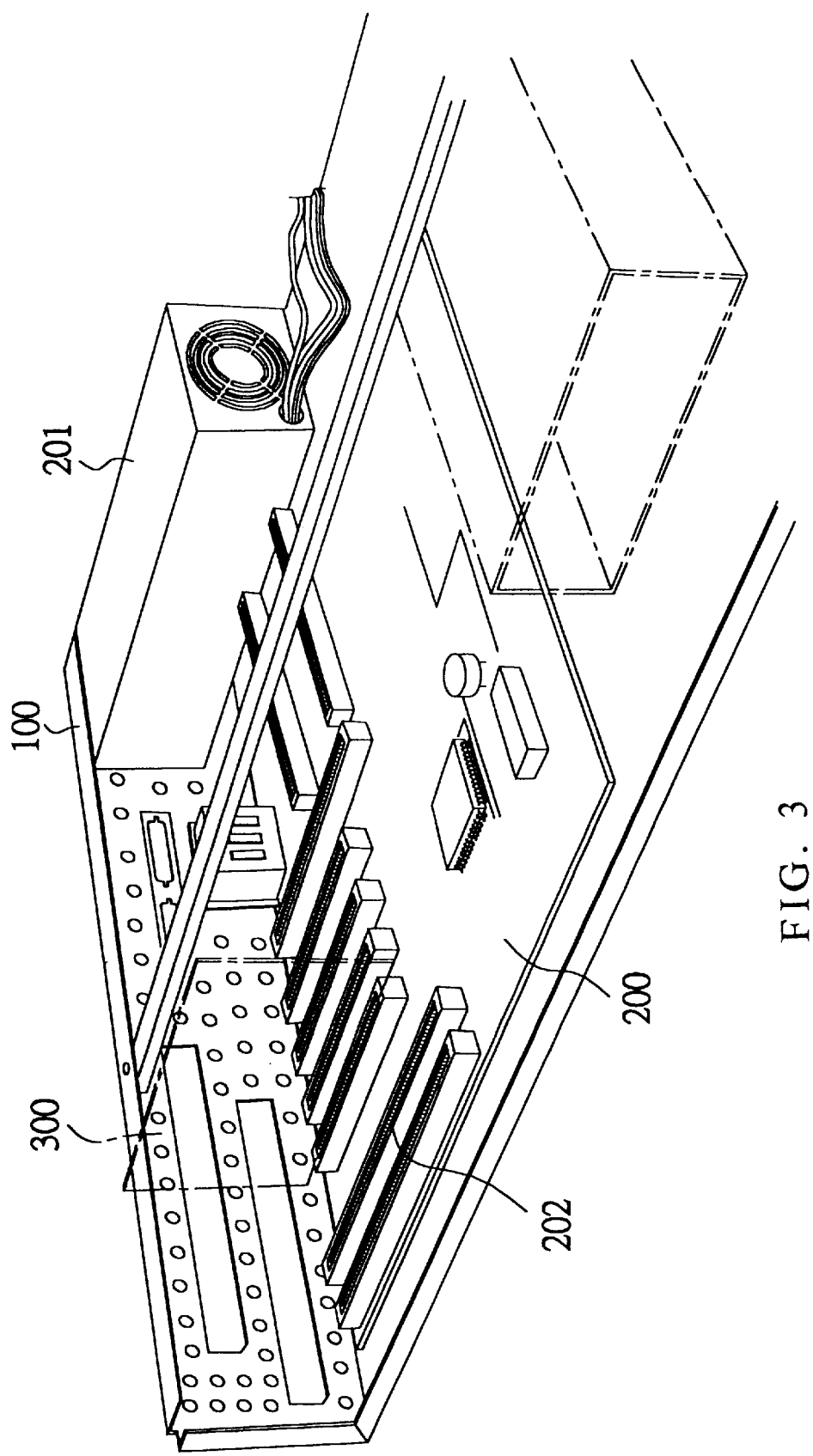
FIG. 3 is a schematic view of the prior art.

In use, with reference to FIGS. 1 and 2, the circuit boards 31 on the connecting elements 30 are inserted into the corresponding insert slots 22 on the motherboard 20. The connecting elements 30 are then secured on the horizontal bar 11 so that they can be firmly secured in position. Mainboards 50 are inserted into the connecting slots 33 of the connecting elements 30. In this way, the mainboards 50 inserted in the connecting slots 33 may extend along a horizontal direction following the orientation of the connecting slots 33. Hence, the profile of the mainboards 50 is relatively smaller than that in the prior art in which the mainboards are directly inserted in the insert slots, and the profile of the overall housing 10 can be reduced to allow stacking of more housings.

Although the present invention has been illustrated and described with reference to the preferred embodiment thereof, it should be understood that it is in no way limited to the details of such embodiment but is capable of numerous modifications within the scope of the appended claims.

What is claimed is:

1. An industrial computer mainframe structure comprising:
   a) a housing;
   b) a motherboard disposed in the housing and having a plurality of first insert slots thereon configured to accept printed circuit boards therein;
   c) a bar connected to the housing so as to be spaced from and extend parallel to the motherboard;
   d) a plurality of connecting elements, each connecting element having a connector extending therefrom in a first direction and inserted into one of the plurality of first insert slots in the motherboard, and a second insert slot opening in a second direction perpendicular to the first direction, at least one of the plurality of connecting elements also attached to the bar; and,
   e) a plurality of links connecting the plurality of connecting elements together, whereby mainboards inserted into the second insert slots extend parallel to the motherboard.

2. The industrial computer mainframe structure of claim 1 wherein the second insert slots are located at different distances from the motherboard.

* * * * *